(12) United States Patent
Horikawa (10) Patent No.: US 10,797,679 B2
(45) Date of Patent: Oct. 6, 2020

(54) ELASTIC WAVE DEVICE

(71) Applicant: Murata Manufacturing Co., Ltd., Nagaokakyo-shi, Kyoto-fu (JP)

(72) Inventor: Harunobu Horikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/507,078

(22) Filed: Jul. 10, 2019

(65) Prior Publication Data
US 2019/0334500 A1    Oct. 31, 2019

Related U.S. Application Data

(63) Continuation of application No. PCT/JP2017/046423, filed on Dec. 25, 2017.

(30) Foreign Application Priority Data

Jan. 13, 2017  (JP) ................ 2017-004287

(51) Int. Cl.
*H03H 9/02*   (2006.01)
*H03H 9/64*   (2006.01)
(Continued)

(52) U.S. Cl.
CPC .......... *H03H 9/02992* (2013.01); *H03H 3/08* (2013.01); *H03H 9/02574* (2013.01);
(Continued)

(58) Field of Classification Search
CPC .. H03H 9/02; H03H 9/02543; H03H 9/02653; H03H 9/02661; H03H 9/02889; H03H 9/15; H03H 9/64
(Continued)

(56) References Cited

U.S. PATENT DOCUMENTS

2002/0074587 A1   6/2002 Takata et al.
2011/0241481 A1*  10/2011 Kimura .............. H03H 9/14541
                                                    310/313 B
(Continued)

FOREIGN PATENT DOCUMENTS

JP    2002-184951 A    6/2002
JP    2011-066492 A    3/2011
(Continued)

OTHER PUBLICATIONS

Official Communication issued in corresponding Japanese Patent Application No. 2018-561911, dated Apr. 14, 2020.
(Continued)

*Primary Examiner* — Dean O Takaoka
(74) *Attorney, Agent, or Firm* — Keating & Bennett, LLP (57) ABSTRACT

An elastic wave device includes a piezoelectric substrate including an IDT electrode provided on one main surface. In the elastic wave device, a center region positioned in a central portion in a direction perpendicular to an elastic wave propagation direction, first and second low acoustic velocity regions positioned outside of the center region, and first and second high acoustic velocity regions positioned outside of the first and the second low acoustic velocity regions in plan view are provided. A groove portion overlaps with one of the first electrode finger and the second electrode finger in plan view in a portion located in the first and second low acoustic velocity regions on the main surface. An acoustic velocity adjusting layer is provided in the groove portion.

20 Claims, 5 Drawing Sheets

(51) Int. Cl.
*H03H 3/08* (2006.01)
*H03H 9/145* (2006.01)
*H03H 9/25* (2006.01)

(52) U.S. Cl.
CPC ...... *H03H 9/1457* (2013.01); *H03H 9/14541* (2013.01); *H03H 9/25* (2013.01)

(58) Field of Classification Search
USPC .......................................................... 333/193
See application file for complete search history.

(56) References Cited

U.S. PATENT DOCUMENTS

| | | | |
|---|---|---|---|
| 2012/0133246 A1 | 5/2012 | Yaoi et al. | |
| 2012/0262028 A1* | 10/2012 | Yamane | H03H 9/0222 |
| | | | 310/313 C |
| 2013/0051588 A1* | 2/2013 | Ruile | H03H 3/08 |
| | | | 381/190 |
| 2013/0088121 A1* | 4/2013 | Yaoi | H03H 9/131 |
| | | | 310/313 A |
| 2014/0001919 A1 | 1/2014 | Komatsu et al. | |
| 2017/0047905 A1 | 2/2017 | Araki et al. | |
| 2018/0062612 A1 | 3/2018 | Daimon et al. | |
| 2018/0212581 A1* | 7/2018 | Matsumoto | H03H 9/02535 |

FOREIGN PATENT DOCUMENTS

| | | |
|---|---|---|
| JP | 2011-130006 A | 6/2011 |
| JP | 2013-518455 A | 5/2013 |
| WO | 2011/018913 A1 | 2/2011 |
| WO | 2012/127793 A1 | 9/2012 |
| WO | 2015/182522 A1 | 12/2015 |
| WO | 2016/170982 A1 | 10/2016 |

OTHER PUBLICATIONS

Official Communication issued in International Patent Application No. PCT/JP2017/046423, dated Jan. 23, 2018.

\* cited by examiner

ELASTIC WAVE DEVICE

CROSS REFERENCE TO RELATED APPLICATIONS

This application claims the benefit of priority to Japanese Patent Application No. 2017-004287 filed on Jan. 13, 2017 and is a Continuation Application of PCT Application No. PCT/JP2017/046423 filed on Dec. 25, 2017. The entire contents of each application are hereby incorporated herein by reference.

BACKGROUND OF THE INVENTION

1. Field of the Invention

The present invention relates to an elastic wave device that utilizes a piston mode.

2. Description of the Related Art

Conventionally, in order to reduce or prevent unwanted waves, an elastic wave device using a piston mode has been proposed.

For example, in Japanese Unexamined Patent Application Publication No. 2013-518455, an example of an elastic wave device using a piston mode is described. This elastic wave device includes an IDT electrode provided on a piezoelectric substrate. The IDT electrode includes a center excitation region located at a center in a direction in which electrode fingers extend, and inner edge regions adjacent to the center excitation region on both sides in the direction in which the electrode fingers extend. Further, the IDT electrode includes outer edge regions that are adjacent to the inner edge regions outside the inner edge regions.

In the inner edge region, a mass addition film made of a dielectric or metal is laminated on an electrode finger, or a width of an electrode finger in the inner edge region is increased. Thus, an acoustic velocity in the inner edge region is lower than acoustic velocities in the center excitation region and the outer edge region. As described above, the inner edge region is a low acoustic velocity region. The outer edge region is a high acoustic velocity region in which an acoustic velocity is higher than in the center excitation region. By arranging the center excitation region, the low acoustic velocity region, and the high acoustic velocity region in this order, energy of an elastic wave is confined and unwanted waves are reduced or prevented.

In recent years, it has been necessary to narrow an electrode finger pitch of an IDT electrode with a trend for higher frequency of an electronic device. However, as described above, in the case where the width of the electrode finger in the inner edge region is increased, as the electrode finger pitch of the IDT electrode becomes narrower, a possibility of a short-circuit defect occurring between the adjacent electrode fingers becomes higher.

On the other hand, when the mass addition film is provided, there is a possibility that a positional displacement of the mass addition film may occur. Further, when the width of the electrode finger becomes narrow, it becomes difficult to form the mass addition film itself. Therefore, the acoustic velocity was not able to be reliably lowered.

SUMMARY OF THE INVENTION

Preferred embodiments of the present invention provide elastic wave devices that are each capable of further reliably and sufficiently lowering an acoustic velocity in a low acoustic velocity region.

An elastic wave device according to a preferred embodiment of the present invention includes a piezoelectric substrate, and an IDT electrode provided on one main surface of the piezoelectric substrate. The IDT electrode includes a first busbar and a second busbar that are opposed to each other, a plurality of first electrode fingers each of which includes one end connected to the first busbar, and a plurality of second electrode fingers each of which has one end connected to the second busbar, the plurality of second electrode fingers being interdigitated with the plurality of first electrode fingers, the IDT electrode including an intersecting region where the first electrode fingers and the second electrode fingers overlap each other in an elastic wave propagation direction. When a direction perpendicular or substantially perpendicular to the elastic wave propagation direction is defined as an intersecting direction in plan view, the intersecting region includes a center region positioned in a central portion in the intersecting direction, a first low acoustic velocity region and a second low acoustic velocity region that are individually disposed on respective sides of the center region in the intersecting direction and that have a lower acoustic velocity than the center region, and the first low acoustic velocity region being positioned on a side of the first busbar and the second low acoustic velocity region being positioned on a side of the second busbar. A first high acoustic velocity region that is positioned between the first busbar and the first low acoustic velocity region and that has a higher acoustic velocity than the center region and a second high acoustic velocity region that is positioned between the second busbar and the second low acoustic velocity region and that has a higher acoustic velocity than the center region are provided. A groove portion overlaps with one of the first electrode fingers and the second electrode fingers in plan view in a portion positioned in the first low acoustic velocity region and the second low acoustic velocity region on the one main surface of the piezoelectric substrate. An acoustic velocity adjusting layer made of a material different from a material of the piezoelectric substrate is provided in the groove portion.

In an elastic wave device according to a preferred embodiment of the present invention, the acoustic velocity adjusting layer fills the groove portion. In this case, the acoustic velocity is able to be effectively lowered in the first low acoustic velocity region and the second low acoustic velocity region.

In an elastic wave device according to a preferred embodiment of the present invention, when each of dimensions of the first electrode fingers, the second electrode fingers, and the groove portion along the elastic wave propagation direction is defined as a width, the width of the groove portion is equal to or smaller than the width of the first electrode fingers and is equal to or smaller than the width of the second electrode fingers. In this case, even when positional displacement of the IDT electrode occurs in a manufacturing process, an effect of lowering the acoustic velocity in the first low acoustic velocity region and the second low acoustic velocity region is able to be obtained, and the adjacent electrode fingers are unlikely to be short-circuited with the acoustic velocity adjusting layer interposed therebetween.

In an elastic wave device according to a preferred embodiment of the present invention, the width of the groove portion is narrower than the width of the first electrode fingers, and is narrower than the width of the second electrode fingers. In this case, even when the positional displacement of the IDT electrode occurs in the manufacturing process, a portion in which the first electrode finger and the second electrode finger are not laminated is unlikely to be generated in the acoustic velocity adjusting layer. Therefore, the acoustic velocity in the first low acoustic velocity region and the second low acoustic velocity region is able to be lowered more reliably and stably.

In an elastic wave device according to a preferred embodiment of the present invention, a density of a material used for the acoustic velocity adjusting layer is higher than an average density of materials used for the IDT electrode. In this case, the acoustic velocity in the first low acoustic velocity region and the second low acoustic velocity region is able to be further lowered.

In an elastic wave device according to a preferred embodiment of the present invention, the groove portion provided in a portion positioned in the first low acoustic velocity region on the one main surface of the piezoelectric substrate overlaps with the second electrode fingers in plan view, and the groove portion provided in a portion positioned in the second low acoustic velocity region overlaps with the first electrode fingers in plan view.

In an elastic wave device according to a preferred embodiment of the present invention, the groove portion extends, on the one main surface of the piezoelectric substrate, to a portion overlapping, in plan view, with a portion other than a portion positioned in the second low acoustic velocity region of each of the plurality of the first electrode fingers and extends, on the one main surface of the piezoelectric substrate, to a portion overlapping, in plan view, with a portion other than a portion positioned in the first low acoustic velocity region of each of the plurality of the second electrode fingers. The acoustic velocity adjusting layer includes a first acoustic velocity adjusting layer and a second acoustic velocity adjusting layer that has a higher acoustic velocity than the first acoustic velocity adjusting layer. The first acoustic velocity adjusting layer is provided in a portion of the groove portion overlapping, in plan view, with a portion of the plurality of first electrode fingers positioned in the second low acoustic velocity region and in a portion of the groove portion overlapping, in plan view, with a portion of the plurality of second electrode fingers positioned in the first low acoustic velocity region, and the second acoustic velocity adjusting layer is provided in a portion of the groove portion other than a portion where the first acoustic velocity adjusting layer is provided in plan view.

In an elastic wave device according to a preferred embodiment of the present invention, a density of a material used for the first acoustic velocity adjusting layer is higher than an average density of materials used for the IDT electrode. In this case, the acoustic velocity in the first low acoustic velocity region and the second low acoustic velocity region is able to be further lowered.

In an elastic wave device according to a preferred embodiment of the present invention, a first dielectric film is provided on the one main surface of the piezoelectric substrate so as to cover the IDT electrode. In this case, the IDT electrode is unlikely to be broken.

In an elastic wave device according to a preferred embodiment of the present invention, a second dielectric film is provided on the one main surface of the piezoelectric substrate, the groove portion, and the acoustic velocity adjusting layer being covered with the second dielectric film, and the second dielectric film is positioned between the IDT electrode and the piezoelectric substrate and between the IDT electrode and the acoustic velocity adjusting layer. In this case, mutual diffusion is unlikely to occur between the material used for the acoustic velocity adjusting layer and the material used for the IDT electrode.

In an elastic wave device according to a preferred embodiment of the present invention, the IDT electrode includes a plurality of first dummy electrode fingers each of which includes one end connected to the first busbar and is opposed to a corresponding one of the plurality of second electrode fingers with a gap interposed therebetween, and a plurality of second dummy electrode fingers each of which includes one end connected to the second busbar and is opposed to a corresponding one of the plurality of first electrode fingers with a gap interposed therebetween.

In an elastic wave device according to a preferred embodiment of the present invention, a material used for the acoustic velocity adjusting layer is metal.

According to preferred embodiments of the present invention, elastic wave devices each capable of further reliably and sufficiently lowering the acoustic velocity in the low acoustic velocity region are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the accompanying drawings, which clarifies the present invention.

It should be noted that each of the preferred embodiments described herein is exemplary and that a partial replacement or combination of the configurations is possible between different preferred embodiments.

Figure 1:
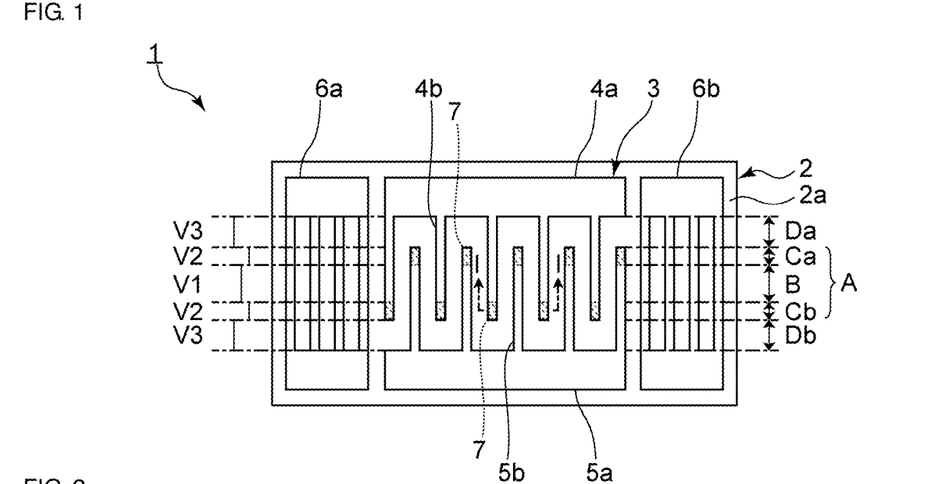
FIG. 1 is a plan view of an elastic wave device according to a first preferred embodiment of the present invention.
Figure 2:
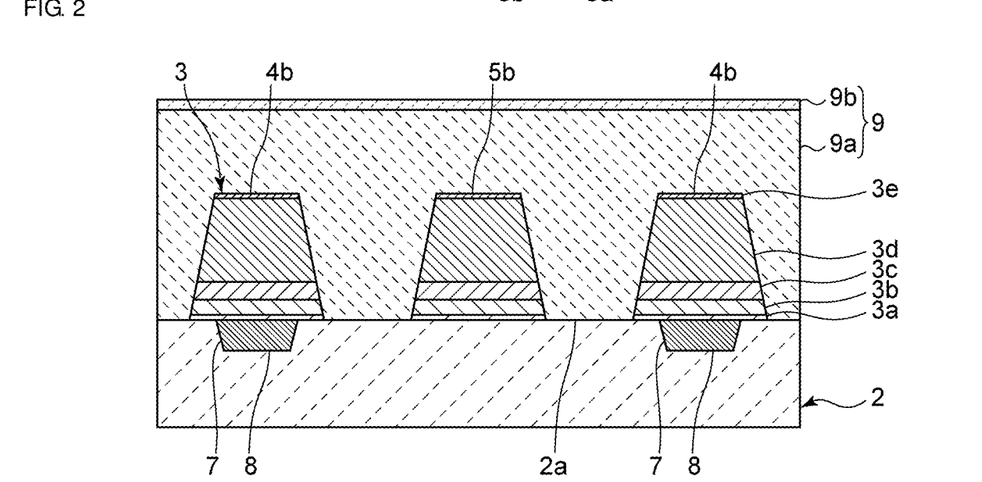
FIG. 2 is a sectional view taken along a line I-I in FIG. 1.

FIG. 1 is a plan view of an elastic wave device according to a first preferred embodiment of the present invention. FIG. 2 is a sectional view taken along the line I-I in FIG. 1. In FIG. 1, a first dielectric film is omitted, and an acoustic velocity adjusting layer is indicated by hatching. The first dielectric film and the acoustic velocity adjusting layer will be described later.

As illustrated in FIG. 1, an elastic wave device 1 includes a piezoelectric substrate 2. As illustrated in FIG. 2, the piezoelectric substrate 2 includes one main surface 2a. The piezoelectric substrate 2 is preferably made of, for example, $LiNbO_3$. Note that the piezoelectric substrate 2 may be made of piezoelectric single crystal such as $LiTaO_3$ other than $LiNbO_3$, or appropriate piezoelectric ceramics, for example.

As illustrated in FIG. 1, an IDT electrode 3 is provided on the piezoelectric substrate 2. By applying an AC voltage to the IDT electrode 3, an elastic wave is excited. Reflectors 6a and 6b are individually disposed on respective sides of IDT electrode 3 in an acoustic wave propagation direction. The elastic wave device 1 of the present preferred embodiment is preferably, for example, a one-port elastic wave resonator.

The IDT electrode 3 includes a first busbar 4a and a second busbar 5a that are opposed to each other. The IDT electrode 3 includes a plurality of first electrode fingers 4b each of which includes one end connected to the first busbar 4a. Further, the IDT electrode 3 includes a plurality of second electrode fingers 5b each of which includes one end connected to the second busbar 5a.

The plurality of first electrode fingers 4b and the plurality of second electrode fingers 5b are interdigitated with each other. The IDT electrode 3 includes an intersecting region A where the first electrode fingers 4b and the second electrode fingers 5b overlap each other in the elastic wave propagation direction. Here, in plan view, a direction perpendicular or substantially perpendicular to the elastic wave propagation direction is defined as an intersecting direction. At this time, the intersecting region A includes a center region B located in a central portion in the intersecting direction, and a first edge region Ca and a second edge region Cb individually disposed on respective sides of the center region B in the intersecting direction. The first edge region Ca is located on a first busbar 4a side, and the second edge region Cb is located on a second busbar 5a side.

The IDT electrode 3 includes a first outer region Da that is located between the first edge region Ca and the first busbar 4a. The IDT electrode 3 includes a second outer region Db that is located between the second edge region Cb and the second busbar 5a.

As illustrated in FIG. 2, in the present preferred embodiment, the IDT electrode 3 is made of a laminated metal film in which a plurality of metal layers are laminated. More specifically, in the IDT electrode 3, a first layer 3a to a fifth layer 3e are laminated in this order from a piezoelectric substrate 2 side. The first layer 3a is preferably made of, for example, a NiCr layer. The second layer 3b is preferably made of, for example, a Pt layer. The third layer 3c is preferably made of, for example, a Ti layer. The fourth layer 3d is preferably made of, for example, an Al layer. The fifth layer 3e is preferably made of, for example, a Ti layer. Note that the types of metal used for the IDT electrode 3 are not limited to the above metals. The IDT electrode 3 may be made of a metal film including a single layer, for example.

In the present preferred embodiment, a side surface of the first electrode finger 4b and a side surface of the second electrode finger 5b are preferably inclined with respect to a thickness direction of the IDT electrode 3. Note that the side surface of the first electrode finger 4b and the side surface of the second electrode finger 5b are not necessarily inclined with respect to the thickness direction of the IDT electrode 3.

A plurality of groove portions 8 are provided on the one main surface 2a of the piezoelectric substrate 2. More specifically, the plurality of groove portions 8 are provided in portions located in the first edge region Ca on the one main surface 2a. The plurality of groove portions 8 are also provided in portions located in the second edge region Cb on the main surface 2a. Each groove portion 8 overlaps with one of the plurality of first electrode fingers 4b and the plurality of second electrode fingers 5b in plan view. In the present preferred embodiment, the groove portion 8 provided in the portion located in the first edge region Ca overlaps with the second electrode finger 5b in plan view. The groove portion 8 provided in the portion located in the second edge region Cb overlaps with the first electrode finger 4b in plan view.

It should be noted that at least one groove portion 8 may be provided in the portion located in the first edge region Ca on the one main surface 2a. The groove portion 8 provided in the portion located in the first edge region Ca may overlap with the first electrode finger 4b in plan view. Similarly, at least one groove portion 8 may be provided in the portion located in the second edge region Cb. The groove portion 8 provided in the portion located in the second edge region Cb may overlap with the second electrode finger 5b in plan view.

Here, each of dimensions of the first electrode finger 4b, the second electrode finger 5b, and the groove portion 8 along the elastic wave propagation direction is defined as a width. In the present preferred embodiment, the width of the groove portion 8 is narrower than the width of the first electrode finger 4b and is narrower than the width of the second electrode finger 5b.

As illustrated in FIG. 2, a cross section of the groove portion 8 preferably has a trapezoidal shape, for example. Note that the shape of the cross section of the groove portion 8 is not limited to the above shape, and may be, for example, a rectangular shape, a substantially semicircular shape, or the like.

An acoustic velocity adjusting layer 7 is provided in each of the plurality of groove portions 8. The acoustic velocity adjusting layer 7 is made of a material different from a material used for the piezoelectric substrate 2. Thus, an acoustic velocity of an elastic wave in the first edge region Ca and the second edge region Cb is lower than an acoustic velocity of an elastic wave in the center region B illustrated in FIG. 1. Here, V1 denotes an acoustic velocity of the elastic wave in the center region B, and V2 denotes an acoustic velocity of the elastic wave in the first edge region Ca and the second edge region Cb. In this case, V1>V2 is satisfied. In this manner, the first edge region Ca and the second edge region Cb are the first low acoustic velocity region and the second low acoustic velocity region that have an acoustic velocity lower than in the center region B.

In the elastic wave device 1, the acoustic velocity adjusting layer 7 fills the groove portion 8. Note that it is sufficient for the acoustic velocity adjusting layer 7 to be provided in the groove portion 8. However, as in the present preferred embodiment, when the acoustic velocity adjusting layer 7 fills the groove portion 8, an acoustic velocity is able to be effectively lowered. In the present preferred embodiment, a material used for the acoustic velocity adjusting layer 7 is preferably metal, for example.

Only the first electrode fingers 4b are located in the first outer region Da. Only the second electrode fingers 5b are located in the second outer region Db. Thus, an acoustic velocity of an elastic wave in the first outer region Da and the second outer region Db is higher than the acoustic velocity of the elastic wave in the center region B. Here, V3 denotes an acoustic velocity in the first outer region Da and the second outer region Db. In this case, V3>V1 is satisfied. As described above, the first outer region Da and the second outer region Db are the first high acoustic velocity region and the second high acoustic velocity region that have an acoustic velocity higher than in the center region B.

Since the first low acoustic velocity region and the second low acoustic velocity region are disposed outside the center region B and the first high acoustic velocity region and the second high acoustic velocity region are disposed outside the first low acoustic velocity region and the second low acoustic velocity region, unwanted waves are able to be reduced or prevented. In this manner, the elastic wave device 1 utilizes a piston mode.

FIG. 1 illustrates the relationship among the respective acoustic velocities V1, V2, and V3 as described above. Note that the acoustic velocity is higher toward a left side in FIG. 1.

As illustrated in FIG. 2, on the one main surface 2a of the piezoelectric substrate 2, a first dielectric film 9 covers the IDT electrode 3. Thus, the IDT electrode 3 is unlikely to be broken. Further, in the present preferred embodiment, the first dielectric film 9 includes a first layer 9a and a second layer 9b. The first layer 9a is preferably made of, for example, $SiO_2$. Thus, an absolute value of a temperature coefficient of frequency is able to be reduced, and frequency temperature characteristics are able to be improved. The second layer 9b is preferably made of, for example, SiN. By adjusting film thickness of the second layer 9b, a frequency is able to be easily adjusted. Note that materials of the first layer 9a and the second layer 9b are not limited to those described above. The first dielectric film 9 may be a single layer. The first dielectric film 9 is not necessarily provided.

One of the unique features of the present preferred embodiment is that the acoustic velocity adjusting layer 7 is provided in each of the plurality of groove portions 8, and therefore, the first low acoustic velocity region and the second low acoustic velocity region are provided. Thus, the acoustic velocity in the first low acoustic velocity region and the second low acoustic velocity region is able to be further reliably and sufficiently lowered. This will be described below.

In manufacturing the elastic wave device 1, the plurality of groove portions 8 are provided on the one main surface 2a of the piezoelectric substrate 2. Next, the acoustic velocity adjusting layer 7 is provided in each of the plurality of groove portions 8. Thereafter, the IDT electrode 3 is formed. At this time, a configuration is able to be obtained in which the first electrode finger 4b and the second electrode finger 5b are individually laminated on the acoustic velocity adjusting layer 7. As described above, simultaneously with the formation of the IDT electrode 3, the first low acoustic velocity region and the second low acoustic velocity region are provided. In this case, in the acoustic velocity adjusting layer 7, since a portion where the first electrode finger 4b and the second electrode finger 5b are not laminated is unlikely to occur, the IDT electrode 3 need only be formed with positional accuracy such that filter characteristics of the elastic wave device 1 or the like do not deteriorate in particular. Therefore, the acoustic velocity in the first low acoustic velocity region and the second low acoustic velocity region is able to be further reliably lowered.

In addition, for example, in a case where the IDT electrode 3 is formed by the lift-off method, the width of the first electrode finger 4b and the width of the second electrode finger 5b tend to be smaller as a distance from the piezoelectric substrate 2 side is larger. The acoustic velocity adjusting layer is located in the groove portion 8 provided on the one main surface 2a of the piezoelectric substrate 2. Thus, the acoustic velocity adjusting layer 7 is located on a side where the width of each of the first electrode finger 4b and the second electrode finger 5b is larger. Accordingly, a structure is able to be further reliably obtained in which the acoustic velocity adjusting layer 7 and the first electrode finger 4b are laminated, and the acoustic velocity adjusting layer 7 and the second electrode finger 5b are laminated.

Here, the acoustic velocity in the configuration in which the first electrode finger 4b and the second electrode finger 5b are individually laminated on the acoustic velocity adjusting layer 7 is compared with an acoustic velocity in a configuration in which the first electrode finger 4b and the second electrode finger 5b are directly provided on the piezoelectric substrate 2. Note that, by comparing impedance frequency characteristics, the acoustic velocities are compared. In both cases, wave lengths are the same or substantially the same. Thus, in FIG. 3, for example, as the resonant frequency is lower, the acoustic velocity is lower.

Figure 3:
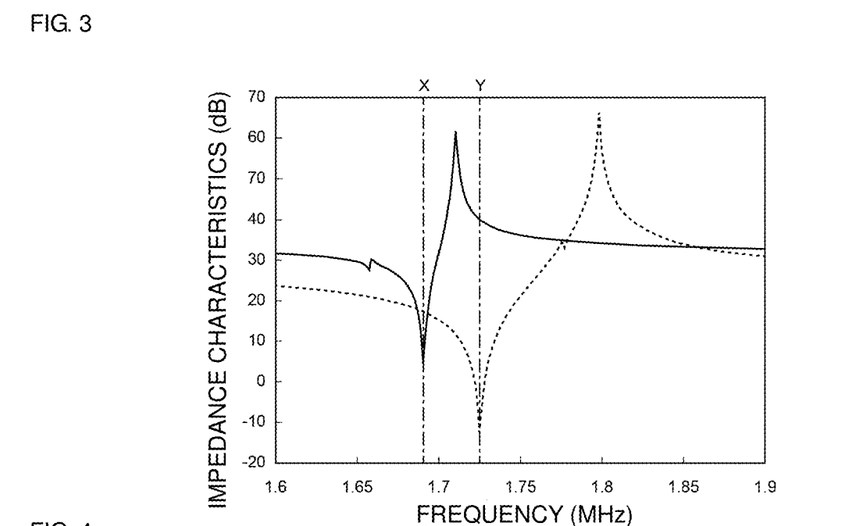
FIG. 3 is a diagram illustrating impedance frequency characteristics in a case where an electrode finger is laminated on an acoustic velocity adjusting layer and a case where an electrode finger is provided directly on a piezoelectric substrate in an elastic wave device.

FIG. 3 is a diagram illustrating impedance frequency characteristics in a case where an electrode finger is laminated on an acoustic velocity adjusting layer and a case where an electrode finger is provided directly on a piezoelectric substrate in an elastic wave device. In FIG. 3, a solid line indicates a result in the case where the electrode finger is laminated on the acoustic velocity adjusting layer, and a broken line indicates a result in the case where the electrode finger is directly provided on the piezoelectric substrate. A dashed-dotted line X indicates a resonant frequency in the case where the electrode finger is laminated on the acoustic velocity adjusting layer, and a dashed-dotted line Y indicates a resonant frequency in the case where the electrode finger is directly provided on the piezoelectric substrate.

As illustrated in FIG. 3, it can be understood that, due to the electrode finger being laminated on the acoustic velocity adjusting layer, the resonant frequency is sufficiently lower than that of the case where the electrode finger is directly provided on the piezoelectric substrate. As described above, since the wave lengths are the same or substantially the same in both the cases illustrated in FIG. 3, as the resonant frequency is lower, the lower the acoustic velocity is, for example. Thus, it is understood that, by laminating the electrode finger on the acoustic velocity adjusting layer, the acoustic velocity becomes sufficiently low. Accordingly, in the present preferred embodiment illustrated in FIG. 1, it is possible to sufficiently lower the acoustic velocity in the first low acoustic velocity region and the second low acoustic velocity region in which the plurality of first electrode fingers 4b and the plurality of second electrode fingers 5b are laminated on the acoustic velocity adjusting layer 7.

Figure 4:
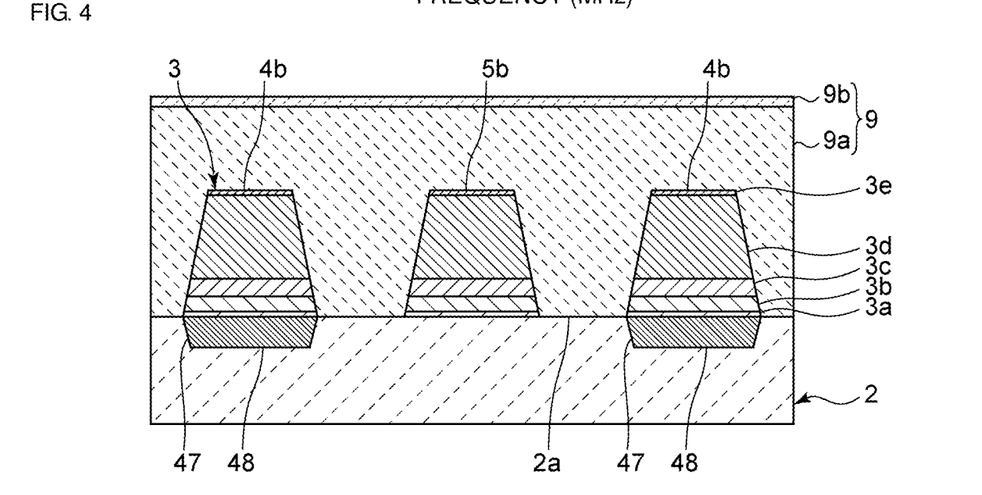
FIG. 4 is an enlarged front sectional view of an elastic wave device according to a first modification of the first preferred embodiment of the present invention.

Preferably, the width of the groove portion 8 illustrated in FIG. 2 is equal to or smaller than the width of the first electrode finger 4b and is equal to or smaller than the width of the second electrode finger 5b. In this case, when the dimension along the elastic wave propagation direction of the acoustic velocity adjusting layer 7 is defined as a width of the acoustic velocity adjusting layer 7, the width of the acoustic velocity adjusting layer 7 is equal to or smaller than the width of the first electrode finger 4b and is equal to or smaller than the width of the second electrode finger 5b. For example, in a first modification of the first preferred embodiment illustrated in FIG. 4, the widths of a groove portion 48 and an acoustic velocity adjusting layer 47 are the same or substantially the same as the widths of the first electrode finger 4b and the second electrode finger 5b. In this case, even when positional displacement of the IDT electrode 3 occurs in the manufacturing process, each of the first electrode finger 4b and the second electrode finger 5b, and the acoustic velocity adjusting layer 47 are able to easily remain in a laminated state. Thus, an effect of lowering the acoustic velocity in the first low acoustic velocity region and the second low acoustic velocity region is able to be obtained. Further, adjacent electrode fingers are unlikely to be short-circuited with the acoustic velocity adjusting layer 47 interposed therebetween.

As in the present preferred embodiment illustrated in FIG. 2, it is more preferable that the widths of the groove portion 8 and the acoustic velocity adjusting layer 7 are narrower than the width of the first electrode finger 4b and narrower than the width of the second electrode finger 5b. In this case, even when the positional displacement occurs in the IDT electrode 3 in the manufacturing process, a portion where the first electrode finger 4b and the second electrode finger 5b are not laminated is unlikely to be provided on the acoustic velocity adjusting layer 7. Accordingly, an area of the portion where the acoustic velocity adjusting layer 7 and the first electrode finger 4b are laminated, and an area of the portion where the acoustic velocity adjusting layer 7 and the second electrode finger 5b are laminated are able to be more reliably set to an area as desired. Therefore, the acoustic velocity in the first low acoustic velocity region and the second low acoustic velocity region is able to be lowered more reliably and stably.

It is preferable that a density of the material used for the acoustic velocity adjusting layer 7 is higher than an average density of materials used for the IDT electrode 3, such that the acoustic velocity in the first low acoustic velocity region and the second low acoustic velocity region is able to be further lowered.

Figure 5:
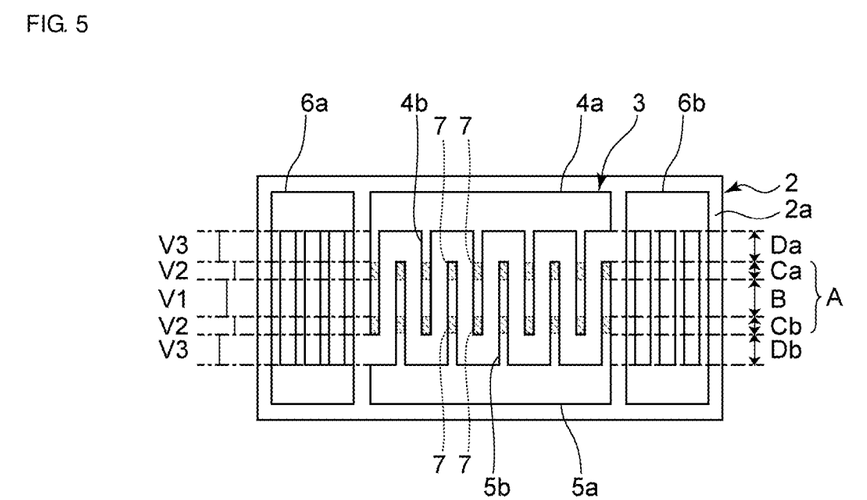
FIG. 5 is a plan view of an elastic wave device according to a second modification of the first preferred embodiment of the present invention.

The groove portion 8 and the acoustic velocity adjusting layer 7 may be provided in portions other than those described above. In the second modification of the first preferred embodiment illustrated in FIG. 5, the groove portion and the acoustic velocity adjusting layer 7 overlap in plan view with both portions located in the first edge region Ca and the second edge region Cb of the first electrode finger 4b on the one main surface 2a of the piezoelectric substrate 2. Similarly, the groove portion and the acoustic velocity adjusting layer 7 overlap in plan view with both portions located in the first edge region Ca and the second edge region Cb of the second electrode finger 5b on the one main surface 2a. In this case, the acoustic velocity in the first low acoustic velocity region and the second low acoustic velocity region is able to be further lowered.

In order to provide the first low acoustic velocity region and the second low acoustic velocity region, when the mass addition film is provided on each of the first electrode finger 4b and the second electrode finger 5b, a protrusion of the first dielectric film 9 becomes large due to the thickness of the mass addition film. On the other hand, in the present preferred embodiment, the first low acoustic velocity region and the second low acoustic velocity region are able to be provided without providing the mass addition film on the first electrode finger 4b and the second electrode finger 5b. Therefore, the first dielectric film 9 is unlikely to protrude largely. Accordingly, variations in filter characteristics or the like of the elastic wave device 1 are able to be reduced or prevented.

Figure 6:
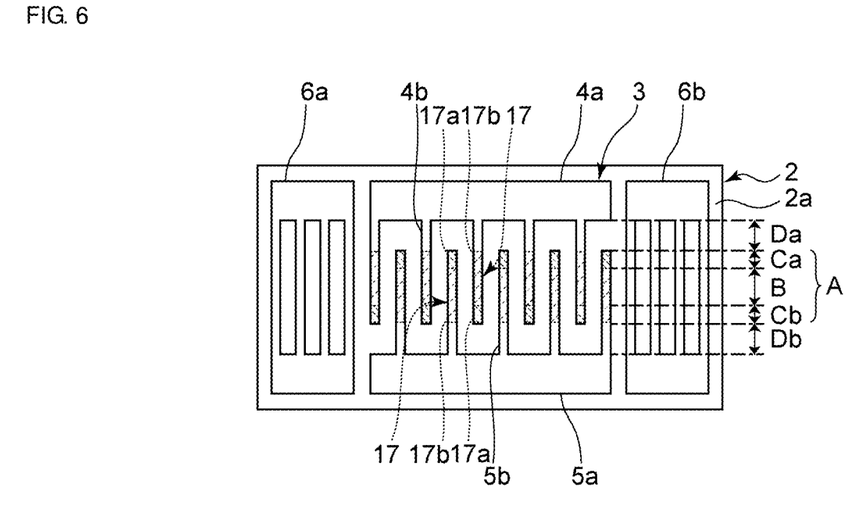
FIG. 6 is a plan view of an elastic wave device according to a second preferred embodiment of the present invention.

FIG. 6 is a plan view of an elastic wave device according to a second preferred embodiment of the present invention. In FIG. 6, a first acoustic velocity adjusting layer and a second acoustic velocity adjusting layer, which will be described later, are illustrated by hatching. In FIG. 6, the first dielectric film is not illustrated. This is also true in plan views after FIG. 6.

In the present preferred embodiment, an area in which the plurality of groove portions are provided is different from that in the first preferred embodiment. An acoustic velocity adjusting layer 17 is provided in each of the plurality of groove portions. Other than the above, the elastic wave device of the present preferred embodiment has the same or substantially the same configuration as that of the elastic wave device 1 of the first preferred embodiment.

More specifically, in the present preferred embodiment, the groove portion overlapping with the first electrode finger 4b in plan view overlaps with the first electrode finger 4b entirely or substantially entirely in a direction in which the first electrode finger 4b extends. Similarly, the groove portion overlapping with the second electrode finger 5b in plan view overlaps with the second electrode finger 5b entirely or substantially entirely in a direction in which the second electrode finger 5b extends.

The acoustic velocity adjusting layer 17 includes a first acoustic velocity adjusting layer 17a and a second acoustic velocity adjusting layer 17b having an acoustic velocity higher than that of the first acoustic velocity adjusting layer 17a. In the present preferred embodiment, metal, for example, is preferably used as materials for the first acoustic velocity adjusting layer 17a and the second acoustic velocity adjusting layer 17b. A density of the material used for the first acoustic velocity adjusting layer 17a is higher than density of the material used for the second acoustic velocity adjusting layer 17b.

In the present preferred embodiment, the first acoustic velocity adjusting layer 17a is provided only in portions of the plurality of groove portions overlapping in plan view with portions of the plurality of first electrode fingers 4b located in the second edge regions Cb and portions of the plurality of second electrode fingers 5b located in the first edge regions Ca. The second acoustic velocity adjusting layer 17b is provided in portions of the plurality of groove portions other than the portions in which the first acoustic velocity adjusting layer 17a is provided in plan view. Thus, the first low acoustic velocity region and the second low acoustic velocity region, which have an acoustic velocity lower than that of the center region B, are provided.

Preferably, a density of a material used for the first acoustic velocity adjusting layer 17a is higher than an average density of materials used for the IDT electrode 3, such that the acoustic velocity in the first low acoustic velocity region and the second low acoustic velocity region is able to be further lowered.

Note that the first acoustic velocity adjusting layer 17a may be provided in both portions, in the groove portion which overlaps in plan view with the first electrode finger 4b, located in the first edge region Ca and the second edge region Cb. The first acoustic velocity adjusting layer 17a may be provided in both portions, in the groove portion which overlaps in plan view with the second electrode finger 5b, located in the first edge region Ca and the second edge region Cb. In this case, the acoustic velocity in the first low acoustic velocity region and the second low acoustic velocity region is able to be further lowered.

As in the first preferred embodiment illustrated in FIG. 1, it is preferable that the groove portion and the acoustic velocity adjusting layer 7 are not provided in the center region B, the first outer region Da, and the second outer region Db. With this, it is possible to further increase a difference among acoustic velocities of the first low acoustic velocity region and the second low acoustic velocity region, the center region B, and the first high acoustic velocity region and the second high acoustic velocity region.

Figure 7:
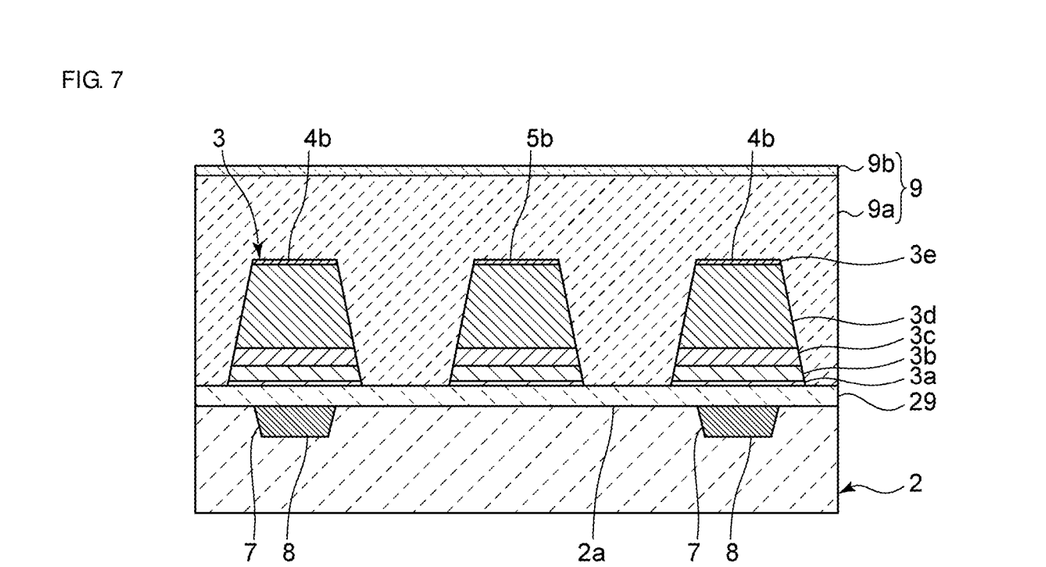
FIG. 7 is an enlarged front sectional view of an elastic wave device according to a third preferred embodiment of the present invention.

FIG. 7 is an enlarged front sectional view of an elastic wave device according to a third preferred embodiment of the present invention. Note that FIG. 7 is a sectional view of a portion corresponding to the line I-I in FIG. 1 in an elastic wave device.

The present preferred embodiment is different from the first preferred embodiment in that a second dielectric film 29 is provided on the one main surface 2a of the piezoelectric substrate 2, and the plurality of groove portions 8 and acoustic velocity adjusting layer 7 are covered with the second dielectric film 29. Other than the above, the elastic wave device of the present preferred embodiment has the same or substantially the same configuration as that of the elastic wave device 1 of the first preferred embodiment.

The second dielectric film 29 is located between the IDT electrode 3 and the piezoelectric substrate 2 and between the IDT electrode 3 and the acoustic velocity adjusting layer 7. Thus, mutual diffusion is unlikely to occur between metal used for the acoustic velocity adjusting layer 7 and metal used for the IDT electrode 3. Thus, it is possible to increase a degree of freedom in the types of metal used for the acoustic velocity adjusting layer 7 and the IDT electrode 3.

In addition, in the present preferred embodiment as well as in the first preferred embodiment, the acoustic velocity in the first low acoustic velocity region and the second low acoustic velocity region is able to be lowered further reliably and sufficiently.

Figure 8:
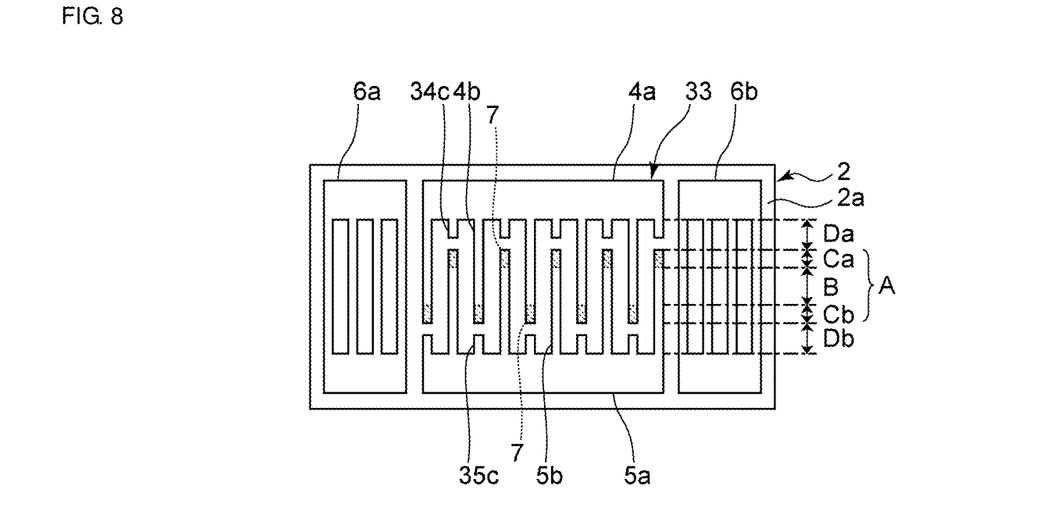
FIG. 8 is a plan view of an elastic wave device according to a fourth preferred embodiment of the present invention.

FIG. 8 is a plan view of an elastic wave device according to a fourth preferred embodiment of the present invention.

The present preferred embodiment is different from the first preferred embodiment in that an IDT electrode 33 includes a plurality of first dummy electrode fingers 34c and a plurality of second dummy electrode fingers 35c. Other than the above, the elastic wave device of the present preferred embodiment has the same or substantially the same configuration as that of the elastic wave device 1 of the first preferred embodiment.

Each of the plurality of first dummy electrode fingers 34c is connected at one end thereof to the first busbar 4a and is opposed to a corresponding one of the plurality of second electrode fingers 5b with a gap interposed therebetween. Each of the plurality of second dummy electrode fingers 35c is connected at one end thereof to the second busbar 5a and is opposed to a corresponding one of the plurality of first electrode fingers 4b with a gap interposed therebetween.

In the present preferred embodiment, as in the first preferred embodiment, the acoustic velocity in the first low acoustic velocity region and the second low acoustic velocity region is able to be lowered further reliably and sufficiently.

Figure 9:
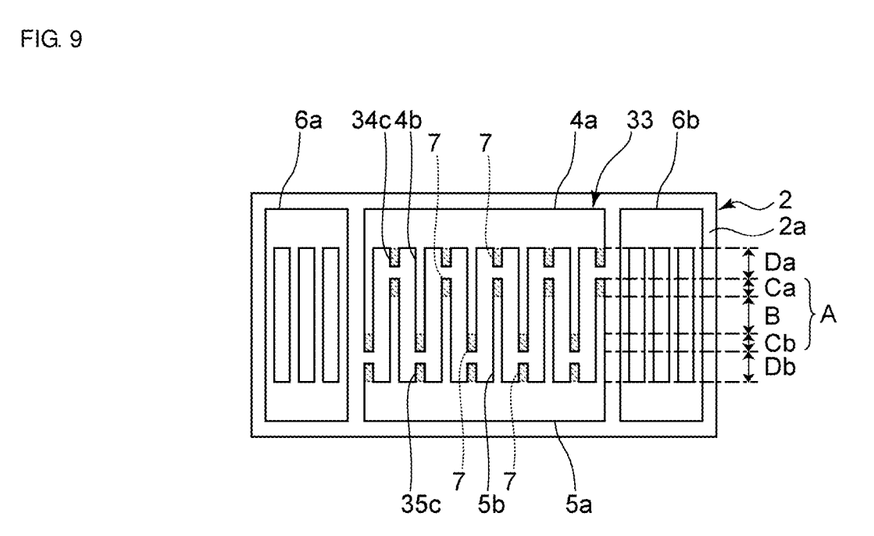
FIG. 9 is a plan view of an elastic wave device according to a modification of the fourth preferred embodiment of the present invention.

FIG. 9 is a plan view of an elastic wave device according to a modification of the fourth preferred embodiment.

In this modification, the groove portion and the acoustic velocity adjusting layer 7 are also provided in a portion of the one main surface 2a of the piezoelectric substrate 2 which overlaps in plan view with the first dummy electrode finger 34c and the second dummy electrode finger 35c. Also in this case, the acoustic velocity in the first low acoustic velocity region and the second low acoustic velocity region is able to be further reliably and sufficiently lowered.

In the first preferred embodiment to the fourth preferred embodiment and each modification thereof, an example of a one-port type elastic wave resonator is described as the elastic wave device. Note that the elastic wave device of the present invention is not limited to the elastic wave resonator. For example, a ladder filter including at least one elastic wave resonator may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device, comprising:
a piezoelectric substrate; and
an IDT electrode provided on one main surface of the piezoelectric substrate; wherein
the IDT electrode includes a first busbar and a second busbar that are opposed to each other, a plurality of first electrode fingers each of which includes one end connected to the first busbar, and a plurality of second electrode fingers each of which includes one end connected to the second busbar, the plurality of second electrode fingers being interdigitated with the plurality of first electrode fingers, the IDT electrode including an intersecting region where the first electrode fingers and the second electrode fingers overlap each other in an elastic wave propagation direction;
when a direction perpendicular or substantially perpendicular to the elastic wave propagation direction is defined as an intersecting direction in plan view, the intersecting region includes a center region positioned in a central portion in the intersecting direction and a first low acoustic velocity region and a second low acoustic velocity region that are individually disposed on respective sides of the center region in the intersecting direction and that have a lower acoustic velocity than the center region, the first low acoustic velocity region being positioned on a side of the first busbar, the second low acoustic velocity region being positioned on a side of the second busbar;
a first high acoustic velocity region that is positioned between the first busbar and the first low acoustic velocity region and that has a higher acoustic velocity than the center region, and a second high acoustic velocity region that is positioned between the second busbar and the second low acoustic velocity region and that has a higher acoustic velocity than the center region are provided;
a groove portion overlaps with one of the first electrode fingers and the second electrode fingers in plan view in a portion positioned in the first low acoustic velocity region and the second low acoustic velocity region on the one main surface of the piezoelectric substrate; and
an acoustic velocity adjusting layer made of a material different from a material of the piezoelectric substrate is provided in the groove portion.

2. The elastic wave device according to claim 1, wherein the acoustic velocity adjusting layer fills the groove portion.

3. The elastic wave device according to claim 1, wherein when each of dimensions of the first electrode fingers, the second electrode fingers, and the groove portion along the elastic wave propagation direction is defined as a width, the width of the groove portion is equal to or smaller than the width of the first electrode fingers and is equal to or smaller than the width of the second electrode fingers.

4. The elastic wave device according to claim 3, wherein the width of the groove portion is narrower than the width of the first electrode fingers, and is narrower than the width of the second electrode fingers.

5. The elastic wave device according to claim 1, wherein a density of a material used for the acoustic velocity adjusting layer is higher than an average density of materials used for the IDT electrode.

6. The elastic wave device according to claim 1, wherein the groove portion provided in a portion positioned in the first low acoustic velocity region on the one main surface of the piezoelectric substrate overlaps with the second electrode fingers in plan view, and the groove portion provided in a portion positioned in the second low acoustic velocity region overlaps with the first electrode fingers in plan view.

7. The elastic wave device according to claim 6, wherein the groove portion extends, on the one main surface of the piezoelectric substrate, to a portion overlapping, in plan view, with a portion other than a portion positioned in the second low acoustic velocity region of each of the plurality of the first electrode fingers and extends, on the one main surface of the piezoelectric substrate, to a portion overlapping, in plan view, with a portion other than a portion positioned in the first low acoustic velocity region of each of the plurality of the second electrode fingers;

the acoustic velocity adjusting layer includes a first acoustic velocity adjusting layer and a second acoustic velocity adjusting layer having a higher acoustic velocity than the first acoustic velocity adjusting layer;

the first acoustic velocity adjusting layer is provided in a portion of the groove portion overlapping, in plan view, with a portion of the plurality of first electrode fingers positioned in the second low acoustic velocity region and in a portion of the groove portion overlapping, in plan view, with a portion of the plurality of second electrode fingers positioned in the first low acoustic velocity region; and     the second acoustic velocity adjusting layer is provided in a portion of the groove portion other than a portion where the first acoustic velocity adjusting layer is provided in plan view.

8. The elastic wave device according to claim 7, wherein a density of a material used for the first acoustic velocity adjusting layer is higher than an average density of materials used for the IDT electrode.

9. The elastic wave device according to claim 1, wherein a first dielectric film is provided on the one main surface of the piezoelectric substrate so as to cover the IDT electrode.

10. The elastic wave device according to claim 1, wherein a second dielectric film is provided on the one main surface of the piezoelectric substrate, the groove portion, and the acoustic velocity adjusting layer being covered with the second dielectric film; and     the second dielectric film is positioned between the IDT electrode and the piezoelectric substrate and between the IDT electrode and the acoustic velocity adjusting layer.

11. The elastic wave device according to claim 1, wherein the IDT electrode includes a plurality of first dummy electrode fingers each of which includes one end connected to the first busbar and is opposed to a corresponding one of the plurality of second electrode fingers with a gap interposed therebetween, and a plurality of second dummy electrode fingers each of which includes one end connected to the second busbar and is opposed to a corresponding one of the plurality of first electrode fingers with a gap interposed therebetween.

12. The elastic wave device according to claim 1, wherein a material used for the acoustic velocity adjusting layer is metal.

13. The elastic wave device according to claim 1, wherein the piezoelectric substrate is made of $LiNbO_3$.

14. The elastic wave device according to claim 1, wherein the IDT electrode is made of a laminated film including a plurality of metal layers that are laminated.

15. The elastic wave device according to claim 14, wherein the plurality of metal layers include first, second, third, fourth, and fifth metal layers.

16. The elastic wave device according to claim 1, wherein the first metal layer is made of NiCr;

the second metal layer is made of Pt;

the third metal layer is made of Ti;

the fourth metal layer is made of Al; and the fifth metal layer is made of Ti.

17. The elastic wave device according to claim 1, wherein each of the plurality of first electrode fingers and the plurality of second electrode fingers includes at least one inclined side surface.

18. The elastic wave device according to claim 1, wherein the groove portion has a trapezoidal shape.

19. The elastic wave device according to claim 9, wherein the first dielectric layer includes a first layer and a second layer disposed on the first layer.

20. The elastic wave device according to claim 19, wherein the first layer is made of $SiO_2$; and the second layer is made of SiN.

\* \* \* \* \*